(12) United States Patent
Varghese

(10) Patent No.: US 6,841,411 B1
(45) Date of Patent: Jan. 11, 2005

(54) METHOD OF UTILIZING A TOP CONDUCTIVE LAYER IN ISOLATING PIXELS OF AN IMAGE SENSOR ARRAY

(75) Inventor: Ronnie P. Varghese, Westminster, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/609,878

(22) Filed: Jun. 30, 2003

(51) Int. Cl.[7] .............................................. H01L 21/00
(52) U.S. Cl. ........................... 438/94; 438/48; 438/50; 438/51; 438/52; 438/66; 438/67; 438/69
(58) Field of Search ............................ 438/50, 51, 52, 438/48, 66, 67, 69

(56) References Cited

U.S. PATENT DOCUMENTS

| | | | |
|---|---|---|---|
| 5,936,261 A | 8/1999 | Ma et al. | |
| 6,326,601 B1 | 12/2001 | Hula et al. | |
| 6,455,836 B1 | 9/2002 | Hula | |
| 6,495,387 B2 * | 12/2002 | French | 438/52 |
| 6,534,333 B2 * | 3/2003 | Bird et al. | 438/48 |

* cited by examiner

*Primary Examiner*—David Nelms
*Assistant Examiner*—Renee R. Berry

(57) ABSTRACT

A method of forming an image sensor array uses a transparent top conductive layer first as an etch mask in forming inter-pixel trenches and then as an etch stop in a planarization step, whereafter the top conductive layer is integral to operation of the completed image sensor array. During fabrication, a stack of layers is formed to collectively define a continuous photosensitive structure over an array area. The operationally dependent transparent top conductive layer is then used in the patterning of the photosensitive structure to form trenches between adjacent pixels. An insulating material is deposited within the trenches and the top conductive layer is then used as the etch stop in planarizing the insulating material. The method includes providing a connectivity layer that provides electrical continuity along the patterned top conductive layer.

17 Claims, 22 Drawing Sheets

METHOD OF UTILIZING A TOP CONDUCTIVE LAYER IN ISOLATING PIXELS OF AN IMAGE SENSOR ARRAY

TECHNICAL FIELD

The invention relates generally to image sensor arrays and more particularly to methods of fabricating an image sensor array having closely spaced pixels.

BACKGROUND ART

Digital images sensors include an array of differentiated photosensitive elements. Depending upon the application, the sensor may have a one-dimensional array or a two-dimensional array of the photosensitive elements. For each element, an electrical charge is generated during each sampling time period, with the electrical charge being proportional to the intensity of light received at the element during the sampling time period.

One type of sensor array utilizes photo diodes to generate the signals that are responsive to received light. FIG. 1 illustrates a single photo diode 10 formed on a pixel interconnection structure 12. The interconnection structure is typically formed on a substrate, such as a semiconductor substrate, using conventional CMOS (Complementary Metal Oxide Silicon) fabrication techniques. A conductive via 14 extends through the interconnection structure to conduct signals from the photo diode. The interconnection structure may be silicon oxide or silicon nitride having tungsten vias 14.

Atop the interconnection structure 12 are three amorphous silicon layers 16, 18 and 20 which form a PIN diode structure. The PIN diode structure is referred to as an "elevated" sensor element, since it is positioned above the surface of the supporting substrate. A lowermost amorphous silicon layer 16 contains an N-type dopant to form one electrode. Atop this bottom electrode is an intrinsic layer 18. The third layer 20 is a P-doped amorphous silicon layer. While only one photo diode is shown in FIG. 1, an array of closely spaced photo diodes is simultaneously fabricated. A substantially transparent top conductive layer 22 provides a common connection to all of the photo diodes. One available material for forming the top conductive layer is ITO (Indium Tin Oxide).

There are a number of issues which must be considered in the design and fabrication of sensor arrays. Defects or impurities along the interfaces of two of the amorphous silicon layers 16, 18 and 20 will degrade performance. If an interface is damaged or is laced with impurities, intended blocking and contact properties will be adversely affected. Ideally, pristine interfaces between the imaging layers are preserved. However, the traditional fabrication techniques for differentiating the pixels within the image array require at least one of the amorphous silicon layers to be patterned in a manner which requires exposure of a layer surface to the ambience and to contamination processing.

Another concern is that defects in the amorphous silicon layers 16, 18 and 20 may be formed by exposure to intense radiation during and after fabrication, such as by the SWE (Staebter-Wronski Effect). Defects and/or impurities lead to inter-pixel leakage during the operation of the image sensor array.

Yet another concern is that the layer patterning which typically occurs prior to deposition of the top conductive layer 22 must consider the step coverage of the material used to form the top conductive layer. Thus, if the upper amorphous silicon layer 20 is patterned in order to differentiate the adjacent pixels, the step coverage of the top conductive layer 22 must be sufficient to conformally cover the resulting topology, or there will be electrical discontinuity within the array. It is difficult to reliably and controllably pattern the upper amorphous layer without encroaching upon or damaging the intrinsic imaging layer 18. Moreover, if only the upper amorphous silicon layer 20 is patterned, the lowermost amorphous silicon layer 16 will be common to all of the pixels, causing some pixel-to-pixel shorting.

FIGS. 2–5 illustrate process steps described in U.S. Pat. No. 5,936,261 to Ma et al., which is assigned to the assignee of the present invention. As shown in FIG. 2, in addition to the three amorphous silicon layers 16, 18 and 20, there is an inner metal layer 24. The inner metal layer is an optional layer that has a low resistivity, enhancing the connection between the conductive vias 14 and the photo diode structure defined by the three amorphous silicon layers. Below the interconnection structure 12 is a substrate 26 and an intermediate interconnection structure 28. Often, the substrate includes CMOS sense circuitry and signal processing circuitry. The intermediate interconnection structure 28 includes pixel-specific conductive paths 30 aligned with the vias 14 and includes an additional conductive path 32 that is subsequently connected to the transparent top conductive layer, not shown. The intermediate interconnection structure 28 may be formed of a subtractive metal or may be formed of a single or dual damascene material.

In FIG. 3, the inner metal layer 24 and the three amorphous silicon layers 16, 18 and 20 have been wet or dry etched in order to form the desired pattern of photo diodes 34 and 36. Then, in FIG. 4, an insulating layer 38 is deposited. As one possibility, silicon dioxide or silicon nitride may be deposited using CVD (Chemical Vapor Deposition) processing. The insulating layer fills the gaps between the photo diodes.

In FIG. 5, the upper surface is planarized by polishing or etching the insulating layer 38. While not shown, the insulating layer may be patterned to expose the conductive via 40 aligned with the path 32 and the transparent top conductive layer may be formed to interconnect all of the photo diodes 34 and 36 to the via 40. The resulting structure is shown in FIG. 6.

A concern with the processing of FIGS. 2–5 is that it requires exacting tolerances with regard to the planarization from FIG. 4 to FIG. 5, such that the upper amorphous silicon layer 20 is not thinned abnormally across the pixel array. Different post-polish or post-etch thicknesses of layer 20 will affect the spectral response across the pixel array. A relaxation of the required tolerances would increase the fabrication yields in forming image sensor arrays.

Another approach to defining the array of photo diodes is to merely pattern the lower electrode or the lower amorphous silicon layer of the different pixels. For example, in FIG. 2, this would result in only the N-type layer 16 or the inner metal layer 24 being patterned, while the upper amorphous silicon layers 18 and 20 are blanket deposited. However, as previously noted, there is a susceptibility to introducing physical defects and/or impurities when the patterning techniques are applied while one of the interface surfaces of the amorphous silicon layers is exposed.

Another approach is to form trenches between adjacent photo diodes before the amorphous silicon layers are formed. Then, when the lower electrode layer is deposited, the layer will "pinch off", at the inter-pixel trenches, thereby isolating the photo diodes. However, this pinch off approach does not isolate the intrinsic amorphous silicon layer, which is the imaging layer, so that extremely pure and stable intrinsic film is required. At different light-induced voltages, parasitic transistor devices can be undesirably formed between the photo diodes. These parasitic transistor devices promote inter-pixel leakage. An extension of the this approach is to pattern both the upper and lower electrodes (layers 16 and 20 in FIG. 1) to provide greater isolation. Again, inter-pixel leakage will occur within the unpatterned intrinsic semiconductor layer 18, which is the imaging layer. Moreover, as previously noted, it is difficult to reliably and controllably pattern the upper electrode layer without encroaching upon or damaging the intrinsic imaging layer. The patterned upper electrode may also introduce successive topology that results in poor conformality of the transparent top conductive layer. Thus, while known approaches provide desired results when sufficient care is taken, each known approach carries risks.

SUMMARY OF THE INVENTION

A method of forming an image sensor array includes utilizing an operationally dependent transparent top conductive layer in the fabrication process to define an array of active pixel regions. By "operationally dependent," what is meant herein is that the optical and/or electrical properties of the top conductive layer are significant during operations of converting light to corresponding electrical signals. Then, the patterning of the top conductive layer is used to determine patterning of the layer stack.

In one application of the invention, the transparent top conductive layer is used as a hard mask in removing selected portions of consecutive amorphous silicon layers that form a PIN structure of a P-type layer, an intrinsic layer, and an N-type layer. The top conductive layer is also used as an etch stop in planarizing the electrically insulating material that is formed within the etched gaps between active pixel regions. By example, if silicon oxide or silicon nitride are deposited after the use of the patterned top conductive layer as the hard mask, chlorine or fluorine chemistry may be used to etch the insulating layer without significantly affecting a top conductive layer of ITO.

The various layers of the layer stack and the top conductive layer may all be blanket deposited. Photolithography may then be used to pattern the top conductive layer. Masking material that is employed in photolithographically patterning the top conductive layer is removed by dry etching or wet stripping or in-situ prior to the deposition of the insulating layer.

Following the step of planarizing the deposited insulating layer using the top conductive layer as the etch stop, continuity of the top conducting layer is re-established. As one possibility, an additional blanket transparent conductive material is added. Alternatively, a dark metal or transparent conductive layer may be added in a pattern to establish electrical continuity along the top coat layer and to provide desired optical shading for interpixel optical isolation.

DETAILED DESCRIPTION

FIGS. 7–11 illustrate a sequence of fabrication steps in accordance with one embodiment of the invention. Other embodiments will be described when referring to subsequent figures. In each embodiment, the operationally dependent top conductive transparent layer is used to pattern an array of electrically and optically isolated photo elements. The results are repeatable, since the processing does not require adherence to exacting tolerances. Moreover, the processing is economical, since it eliminates at least one processing level relative to prior approaches of patterning the array. Specifically, the processing is simplified by decreasing the mask and etch levels as a consequence of patterning amorphous silicon layers by means of defining the layer geometries in the operationally dependent top conductive layer mask and in the pixel isolation etch.

Figure 1:
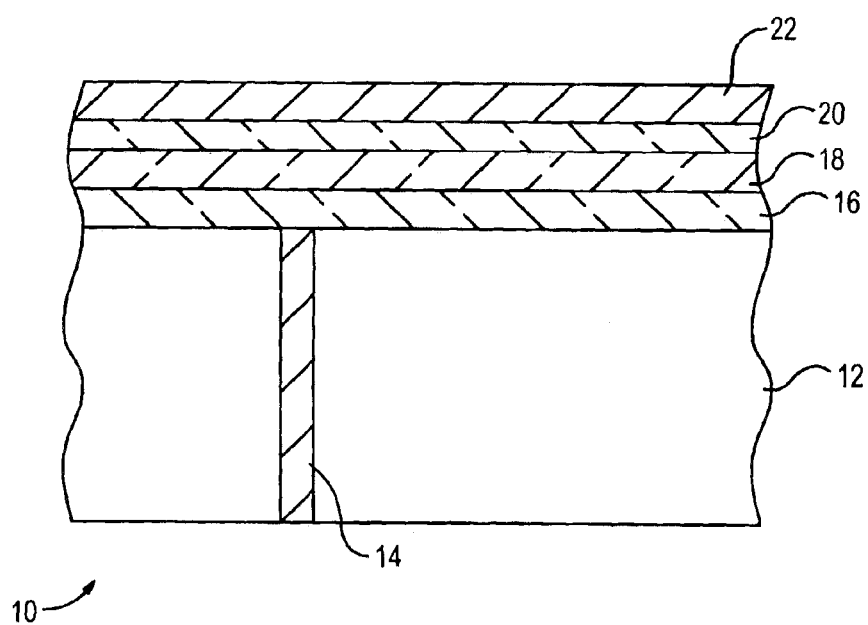
FIG. 1 is a cross sectional view of a PIN photo diode which may be the focus of a fabrication process in accordance with the present invention.
Figure 2:
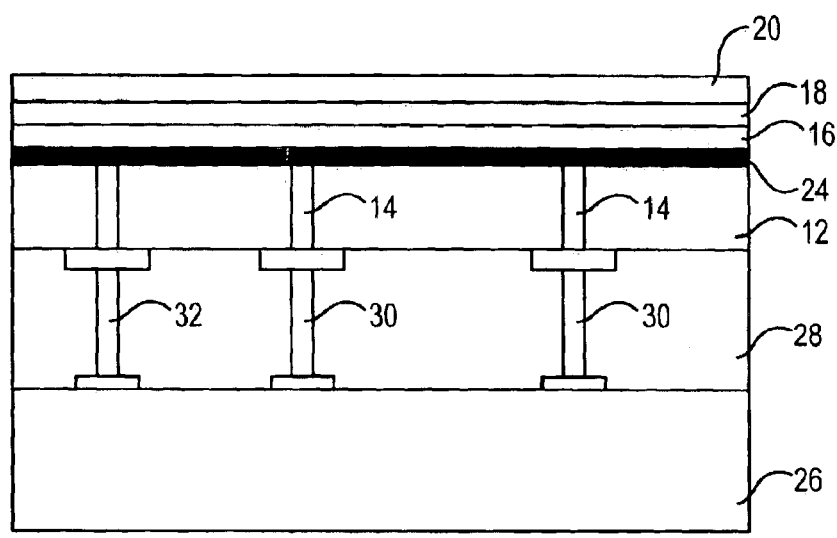
FIGS. 2–5 illustrate a sequence of steps to form an image sensor array in accordance with a prior art approach.
Figure 3:
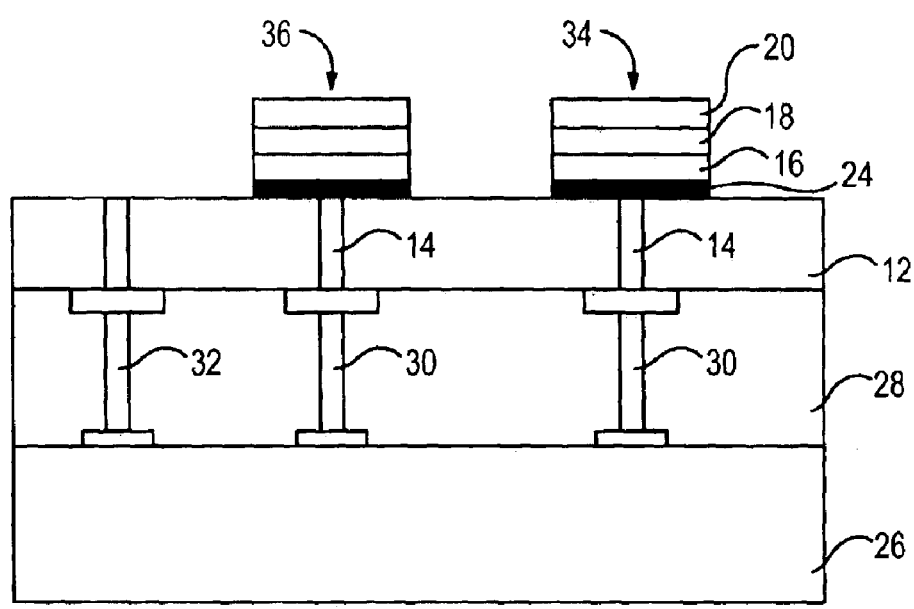
Figure 4:
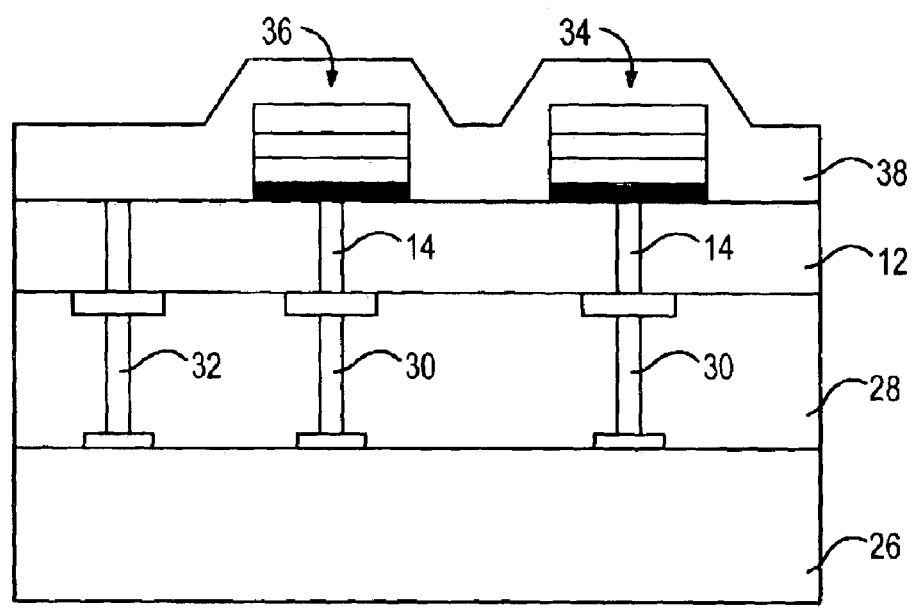
Figure 5:
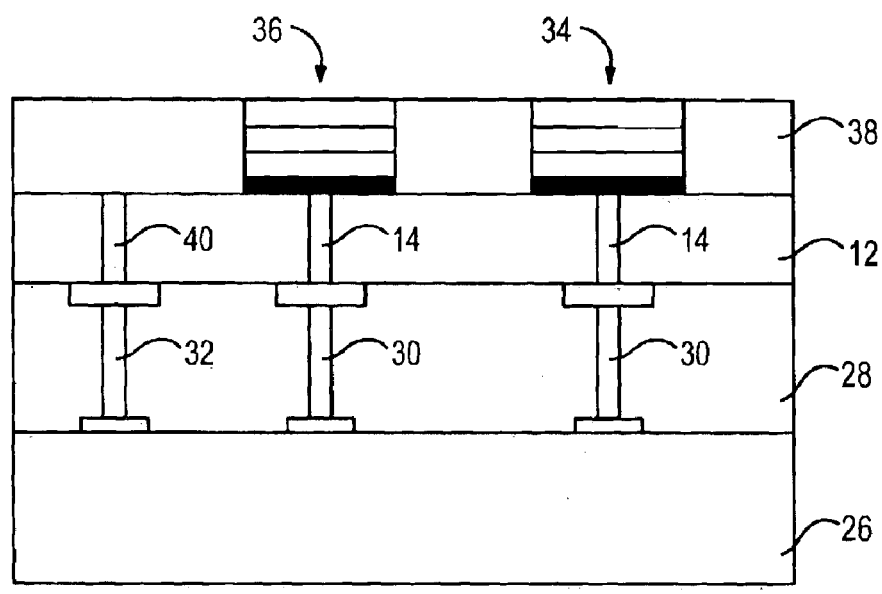
Figure 6:
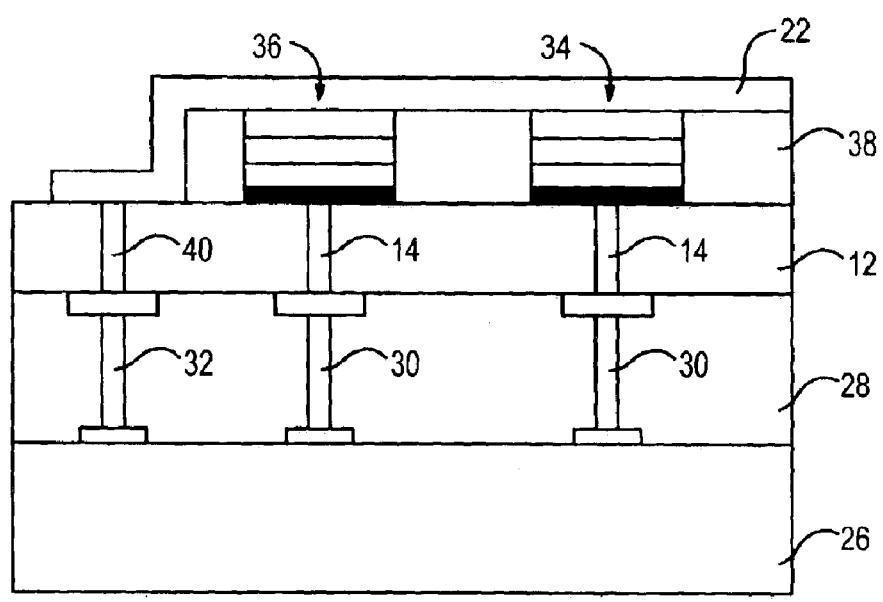
FIG. 6 is a side sectional view of a fabricated image sensor array.
Figure 7:
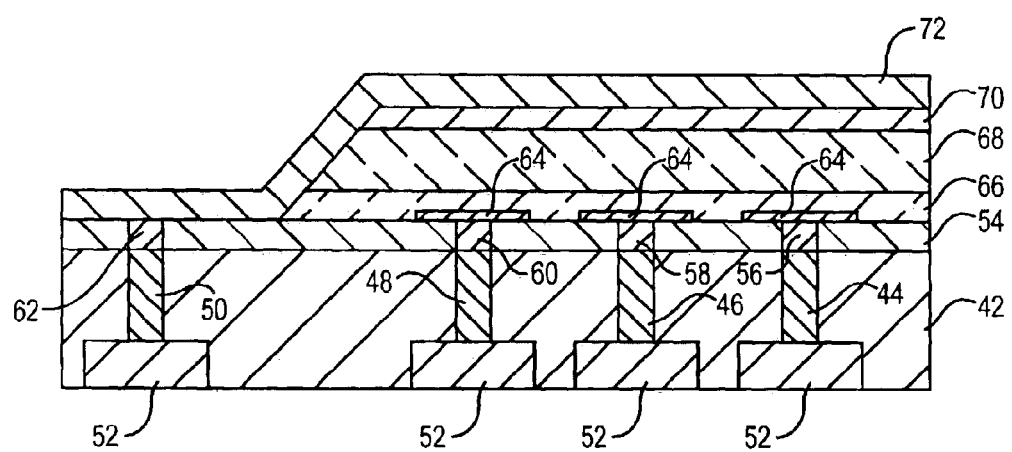
FIG. 7 is a sectional view of an imaging structure following the steps of forming PIN layers and a transparent top conductive layer in accordance with one embodiment of the present invention.

With reference to FIG. 7, a lower interconnection structure 42 is formed on a substrate. The interconnection structure 42 is known in the art. The structure may be formed of a subtractive metal or may be formed of a single or dual damascene material. The structure includes conductive paths 44, 46, 48 and 50, which originate from metallic pads 52, such as molybdenum or standard interconnect pads on the underlying substrate.

An upper interconnection structure 54 includes conductive vias 56, 58, 60 and 62 that are aligned with the paths 44, 46, 48 and 50 of the lower interconnection structure 42. The upper interconnection structure provides reliability and structural advantages to the "elevated" PIN photo diodes that are to be fabricated. The bulk of the interconnect structure may be silicon dioxide or silicon nitride, while the vias may be formed of tungsten. The interconnection structure 54 enables formation of metal pads 64, since the pads are formed over silicon oxide or silicon nitride rather than the material for forming the lower interconnection structure 42. The metallic pads 64 may be titanium nitride or any other suitable conductive material that ensures a low resistance connection between the vias and the individual photo diodes to be fabricated. The benefit of the lower interconnection structure 42 is that the density of signal processing circuitry on the underlying substrate can be increased as compared to real estate availability if the photo diodes were to be fabricated directly atop the substrate.

Above the upper interconnection structure 54 are three amorphous silicon layers 66, 68 and 70. In one application of the invention, the three layers 66, 68 and 70 combine to form a PIN photosensitive region, but NIP photosensitive regions are also a possibility. For the first deposited layer 66, an N dopant is introduced into the amorphous silicon during the deposition process. A suitable dopant is phosphorous. The material should be sufficiently doped that the pixel electrode fully depletes when biased during operation. PECVD (Plasma Etched Chemical Vapor Deposition) techniques may be used. A silicon-containing gas (such as $Si_2H_6$ or $SiH_4$) is often included when forming amorphous silicon pixel electrodes.

The center amorphous silicon layer 68 is an intrinsic layer. Such layers are generally formed from hydrogenated amorphous silicon and may be deposited using PECVD processing or reactive sputter processing. The deposition temperature should be sufficiently low that the hydrogen is retained within the deposited material. A suitable thickness is 1 micron.

The third amorphous silicon layer 70 is doped with a P-type material, such as boron. The thickness of the layer is selected to ensure that it does not absorb excessive short wavelength light (e.g., blue) during operation. As with the other two amorphous silicon layers 66 and 68, PECVD processing may be used to form the layer. All three layers are blanket deposited. The layers are patterned to expose the conductive via 62. The non vertical left edges of the layers (as viewed in FIG. 7) are a result of anisotropic etching of the layers. Other processing may be substituted.

A top conductive layer 72 is then formed. The top conductive layer may be ITO, but other suitable materials include thin layers of titanium nitride, silicide and certain types of transition metal nitrides and oxides. Important properties of the top conductive layer 72 are the ability to electrically connect photosensitive pixels and the ability to allow light to pass through the layer in order to impinge upon the photosensitive pixels.

Figure 8:
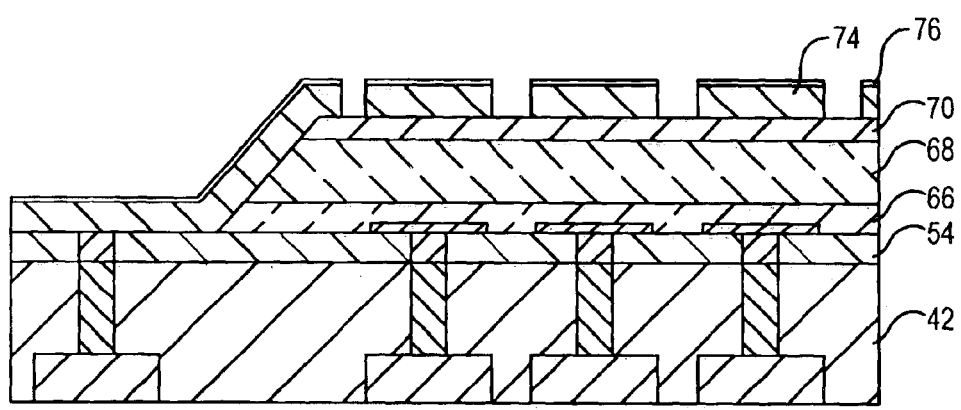
FIG. 8 is a sectional view of the imaging structure of FIG. 7 following patterning of the top conductive layer.

In FIG. 8, the transparent top conductive layer 72 of FIG. 7 has been altered using photolithographic techniques to yield a patterned top conductive layer 74. A photomask 76 is shown as residing on the patterned top conductive layer. Conventional photolithographic processing may be employed, but other methods of providing a patterned top conductive layer may be substituted. For example, techniques are known for selectively depositing the ITO material, so that etching of the material is not required.

Figure 9:
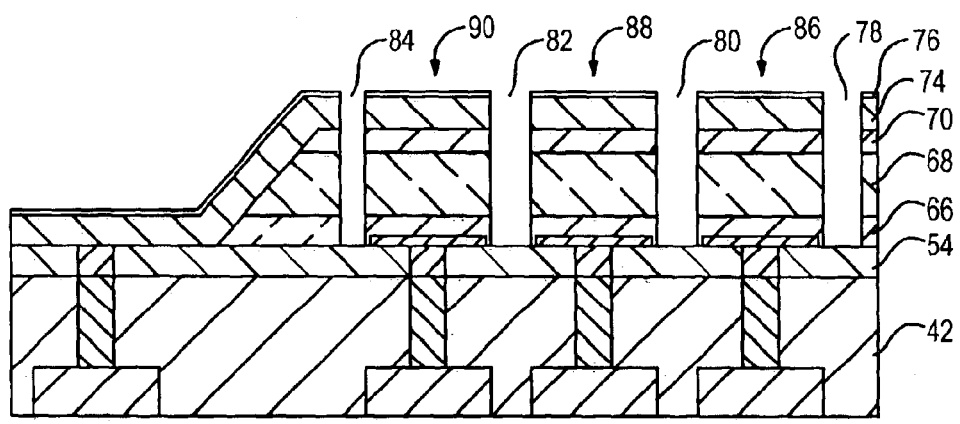
FIG. 9 is a sectional view of the imaging structure of FIG. 8 following the use of the patterned top conductive layer as a mask for etching the amorphous silicon layers.

In FIG. 9, the patterned top conductive layer 74 is used as a hard mask to pattern isolation trenches 78, 80, 82 and 84 that define the array of photosensitive pixels 86, 88 and 90. In the embodiment of FIG. 9, each photosensitive pixel is a PIN photo diode. An etchant is selected on the basis of having a high selectivity in etching the amorphous silicon layers 66, 68 and 70 relative to the material of the patterned top conductive layer 74.

Figure 10:
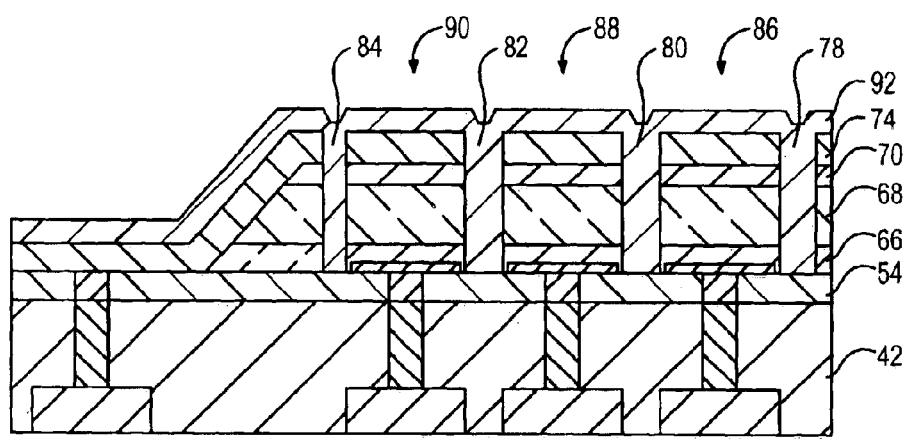
FIG. 10 is a sectional view of the imaging structure of FIG. 9 following deposition of an insulating material.

In FIG. 10, an insulating layer 92 is shown as having been deposited on the surface of the patterned top conductive layer 74 and in the isolation trenches 78, 80, 82 and 84. The insulating material should have sufficient step coverage to fill a substantial portion of each trench, although complete coverage of the volume of the trenches is not imperative. PETEOS deposition at 300 degrees Celsius may be used, where PETEOS refers to Plasma-Enhanced deposition of oxides from TEOS (tetra-ethyl-ortho-silicate). In comparing FIGS. 9 and 10, it can be seen that the photomask 76 no longer resides on the surface of the patterned top conductive layer 74. The photomask layer 76 was removed by wet etching or dry stripping or in-situ prior to PETEOS deposition. Even if a process were to be developed to provide PETEOS deposition at less than 100 degrees Celsius, with the photomask 76 remaining intact, the end product would be adversely affected, since the photomask over the transparent ITO will significantly alter the imaging properties of the photosensitive pixels 86, 88 and 90.

Figure 11:
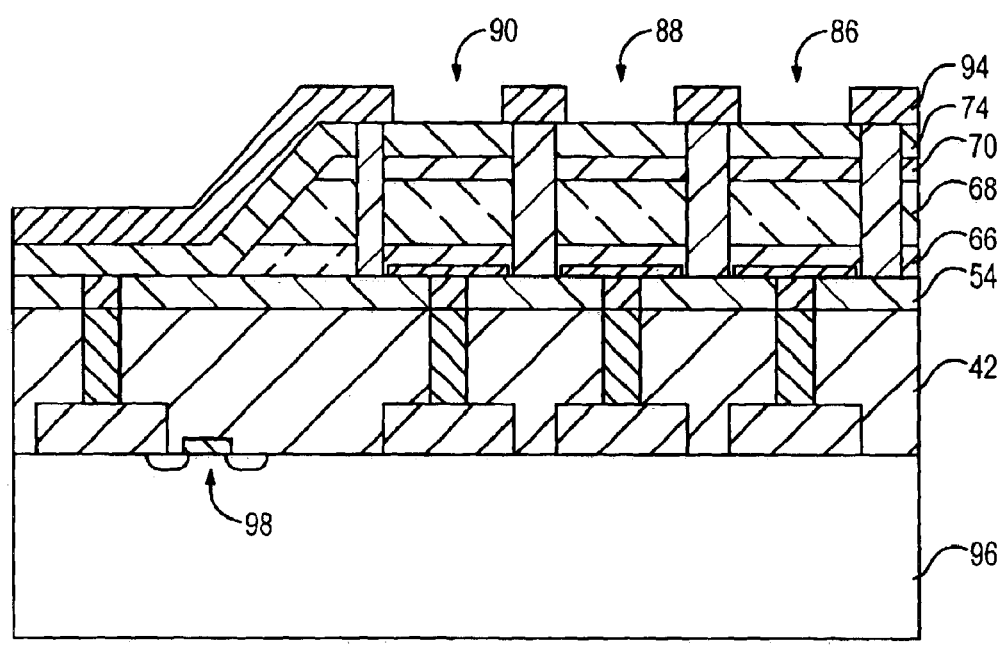
FIG. 11 is a sectional view of the imaging structure of FIG. 10 following the planarization of the insulating layer and the deposition of a dark metal layer.

Referring now to FIG. 11, the patterned top conductive layer 74 is used as an etch stop in providing PETEOS etch back. That is, the planarization of the insulating material employs the transparent conductive layer as an etch stop.

Figure 12:
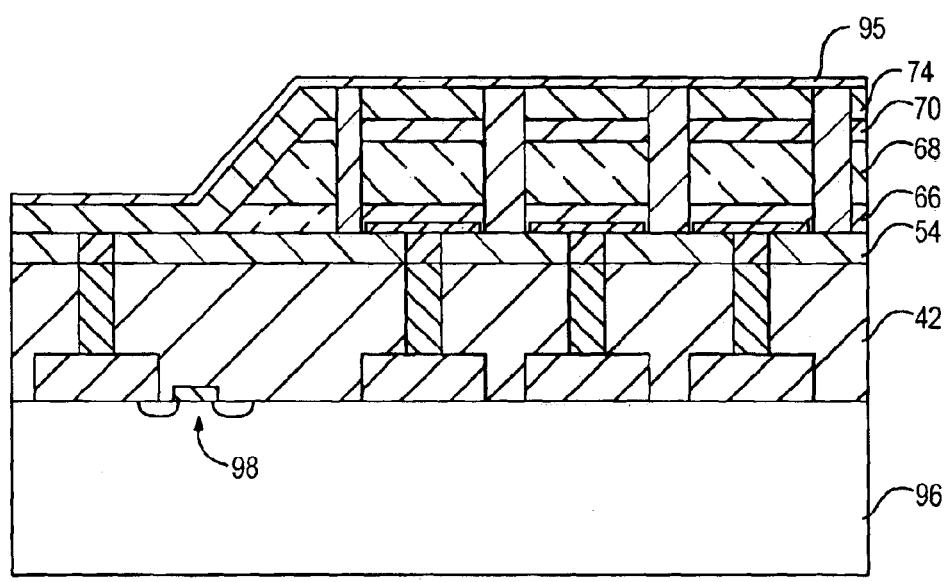
FIG. 12 is a sectional view of the structure of FIG. 11, but with a blanket deposition of a transparent conductive material being used in place of the dark metal layer.

In addition to the planarization, FIG. 11 illustrates the deposition of a patterned connectivity layer 94. The connectivity layer re-establishes the electrical conductivity along the top conductive layer 74, so that the entire layer is connected to the via 62 and the conductive path 50 that provide the correct bias to each photosensitive pixel 86, 88 and 90. In the embodiment shown in FIG. 11, the connectivity layer may be a dark metal layer that provides shading, as described in U.S. Pat. No. 6,326,601 to Hula et al. and U.S. Pat. No. 6,455,836 to Hula. The dark metal layer may be tungsten or titanium-tungsten that provides the connectivity function and that acts as a light-shielding layer over one or more of the photosensitive pixels in the array to form a dark reference device or dark pixel. As an alternative to using the dark metal layer 94, FIG. 12 illustrates the use of a second transparent conductive layer 95 may be blanket deposited across the structure. The thin transparent layer 95 may be used to provide the connectivity for applications in which light shielding is not desired.

FIG. 11 also shows a substrate 96 and a single transistor 98 that is used to represent the image collection and signal processing circuitry fabricated on the substrate 96. As previously noted, the substrate may be a semiconductor substrate, such as silicon.

Figure 13:
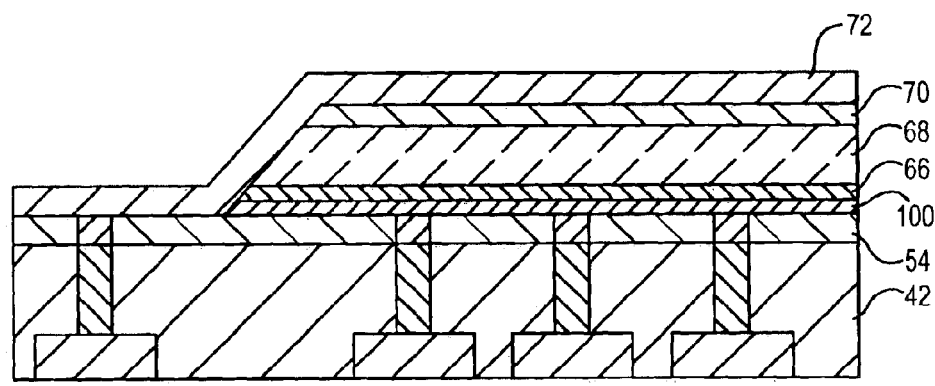
FIGS. 13–17 illustrate process steps in accordance with a second embodiment of the invention.

FIGS. 13–17 illustrate a second embodiment of the invention. Many of the features and steps are identical to those described with reference to the first embodiment, allowing reference numerals to be duplicated in the drawings. In FIG. 13, the only difference is that the sequence of depositing a layer stack includes the formation of a metal layer 100 that will be subsequently patterned to form pads similar to the pads 64 of FIG. 7. As one possibility, the layer 100 may be titanium nitride. The metal layer 100 is the same as the layer that forms the pads, except that layer 100 is not patterned initially.

Figure 14:
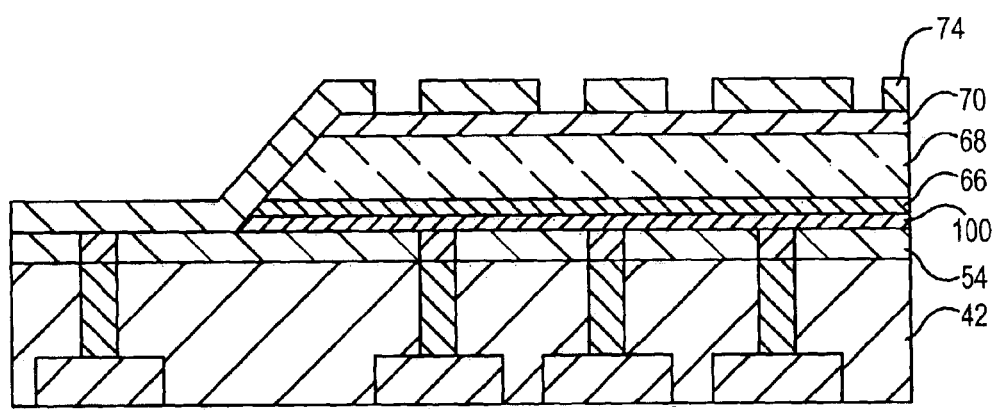
Figure 15:
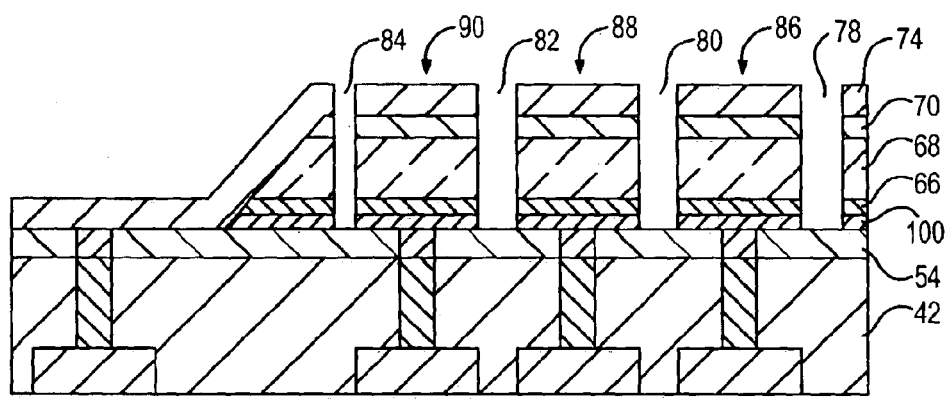
Figure 16:
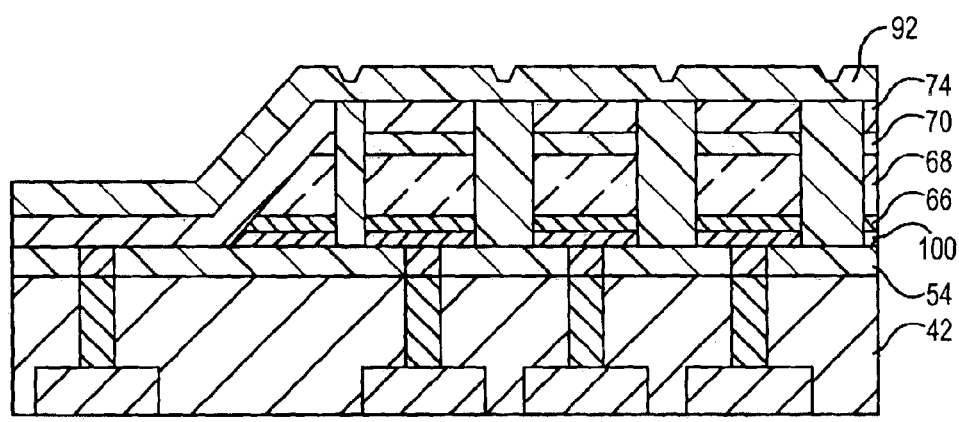
Figure 17:
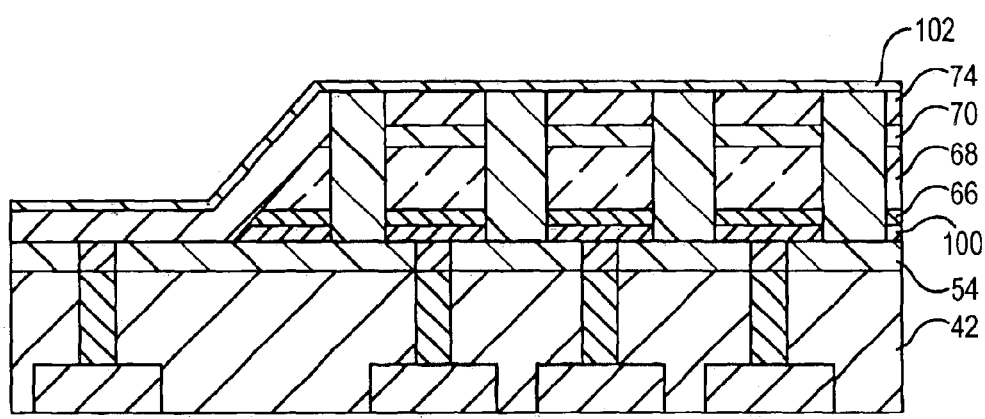

In FIG. 14, photolithography yields the patterned top conductive layer 74 that is used as the hard mask and the etch stop for the isolation of photosensitive pixels. In FIG. 15, the pixels 86, 88 and 90 are formed by etching the trenches 78, 80, 82 and 84. In this embodiment, the etching includes patterning the metal layer 100, in addition to the three amorphous silicon layers 66, 68 and 70. The deposition of the insulating layer 92 in FIG. 16 extends to the surface of the upper interconnection structure 54. The insulating material is then etched in order to planarize the top surface, with the patterned top conductive layer 74 being used as the etch stop. Finally, in FIG. 17, a thin layer 102 is deposited to re-establish continuity along the surface of the patterned top conductive layer 74. The layer 102 takes the place of the dark metal connectivity layer 94 of FIG. 11. The layer 102 may be ITO or any other transparent conductive material. However, one can also employ a patterned dark metal connectivity 94 in this embodiment of the invention.

Figure 18:
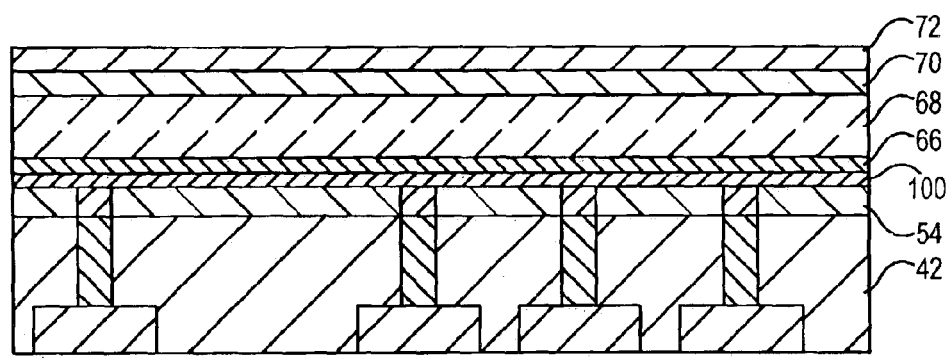
FIGS. 18–22 illustrate process steps for a third embodiment of the invention.
Figure 19:
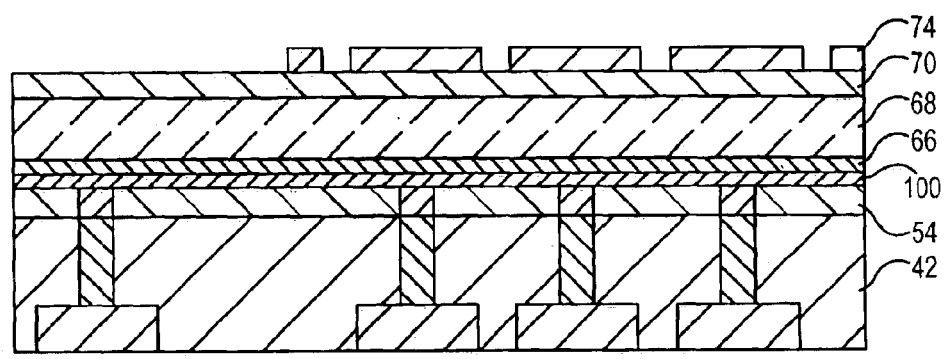

FIGS. 18–22 illustrate a third embodiment of the invention. Referring firstly to FIG. 18, in this embodiment, the top conductive layer 72 is blanket deposited prior to the preliminary etching of the amorphous silicon layers 66, 68 and 70 and the metal layer 100. Thus, the various layers extend continuously across the surface of the upper interconnection structure 54. As a consequence, the patterned top conductive layer 74 of FIG. 19 has a different configuration than in the first two illustrated embodiments. Specifically, the patterning includes a leftward portion (as viewed in FIG. 19) that exposes the region of the amorphous silicon layers and the metal layer 100 that are to be etched in order to reach the conductive via 62. Optionally, the etching process may be implemented to allow the metal layer 100 to remain intact while the amorphous silicon is etched.

Figure 20:
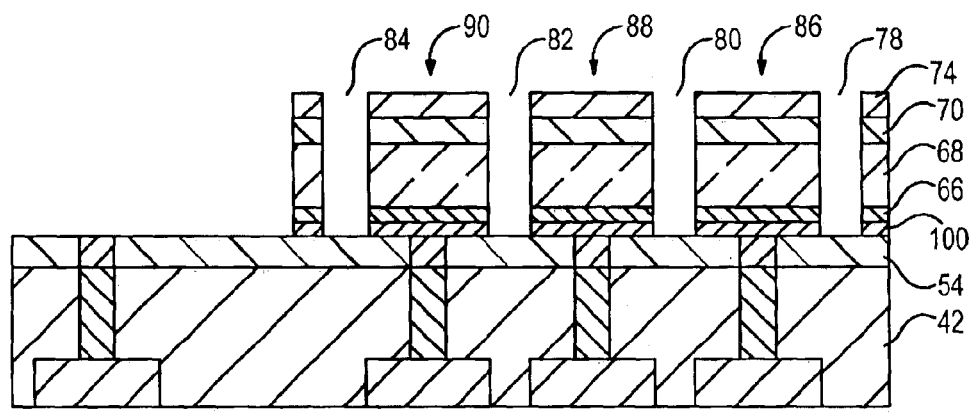
Figure 21:
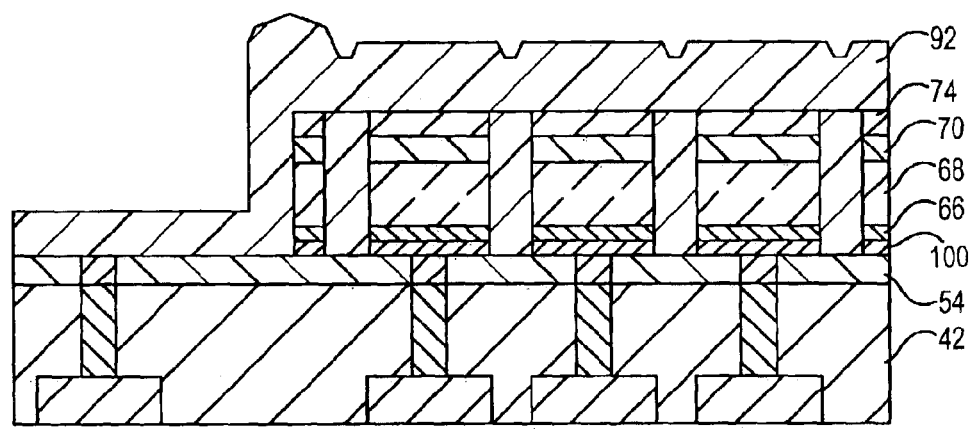
Figure 22:
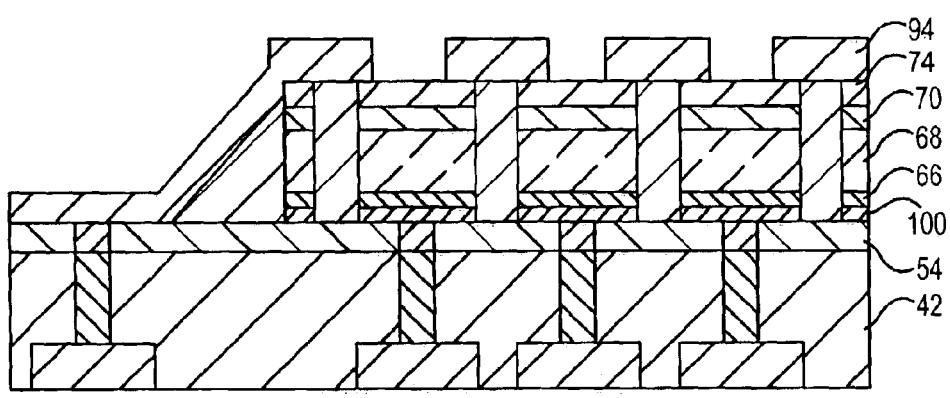

In FIGS. 20 and 21, the patterned top conductive layer 74 is used as a hard mask in the etching of the layers to yield the trenches 78, 80, 82 and 84 that space apart the adjacent photosensitive pixels 86, 88 and 90. The insulating layer 92 is deposited within the trenches and on the exposed region of the upper interconnection structure 54. In FIG. 22, the assembly is planarized and the connectivity layer 94 is added. In this embodiment, the connectivity layer is a patterned dark metal layer, but a blanket deposition of a transparent conductive material, such as ITO, may be substituted.

While the layers that form the PIN photo diode have been described as being amorphous silicon layers, other materials may be used. As one example, the layers may be appropriately doped amorphous germanium layers. Moreover, the photosensitive pixels may be NIP photo diodes, as previously noted. Other modifications of the previously described embodiments are also possible without diverging from the invention.

What is claimed is:

1. A method of forming an image sensor array comprising:
    forming a stack of layers that collectively define a continuous photosensitive structure over an array area, including blanket depositing a plurality of amorphous silicon layers without exposure to ambient air;
    providing a patterned generally transparent top conductive layer on said stack of layers;
    using said patterned top conductive layer to determine patterning of said stack of layers within said array area so as to define an array of active pixel regions; and
    maintaining optical and electrical properties of said patterned top conductive layer for subsequent operations of said active pixel regions in converting light into electrical energy.

2. The method of claim 1 wherein said forming said stack of layers includes depositing a sequence of said layers such that a photo diode is fabricated, including depositing said sequence in a generally evacuated environment.

3. The method of claim 2 wherein said depositing said sequence includes forming a PIN structure of amorphous silicon, said PIN structure having a P-type layer, an intrinsic layer and an N-type layer that are formed by in-situ depositions without exposure to contaminating processing.

4. The method of claim 2 wherein said using said patterned top conductive layer to determine said patterning includes collectively etching said layers of said sequence to isolate each said active pixel region.

5. The method of claim 4 wherein said using said patterned top conductive layer further includes introducing electrically insulating material through openings in said patterned top conductive layer, thereby providing said electrically insulating material between adjacent said active pixel regions.

6. The method of claim 5 wherein said using said top conductive layer further includes planarizing said electrically insulating material while using said top conductive layer as an etch stop material.

7. The method of claim 1 further comprising forming said patterned top conductive layer by:
    blanket depositing conductive material on said stack of layers; and
    photolithographically defining a pattern in said conductive material, wherein said pattern defines a geometry of said array of active pixel regions.

8. The method of claim 7 further comprising forming a substantially opaque dark metal layer on said portions of said patterned top conductive layer so as to enable electrical continuity along said patterned top conductive layer and to promote optical isolation among said active pixel regions.

9. A method of fabricating an image sensor array comprising:
    providing a substrate;
    depositing a succession of generally continuous layers such that a continuous photosensitive diode area is formed along a surface of said substrate, including using in-situ deposition techniques to form said continuous photosensitive diode area;
    forming a continuous transparent conductive material atop said photosensitive diode area;
    patterning said transparent conductive material on a basis of a preselected arrangement of isolated pixel regions, including forming openings through said transparent conductive material in correspondence with said preselected arrangement;
    removing portions of said layers within said photosensitive diode area while using said transparent conductive material as an etch mask such that said preselected arrangement of isolated pixel regions is established, said portions being aligned with said openings;
    depositing electrically insulating material through said openings in said transparent conductive material and between said isolated pixel regions; and
    planarizing said electrically insulating material using said transparent conductive material as an etch stop.

10. The method of claim 9 wherein said patterning said transparent conductive material includes utilizing photolithographic techniques in which a photomask material is selected to burn off during or prior to said step of depositing said electrically insulating material.

11. The method of claim 9 further comprising providing a patterned dark metal layer on said transparent conductive material to provide electrical continuity along said transparent conductive material during operation of said image sensor array.

12. The method of claim 9 wherein said step of depositing said succession of generally continuous layers includes forming a PIN amorphous silicon structure without exposure to ambient air or contaminating processing, said step of removing including etching through each said layer of said PIN amorphous silicon structure.

13. The method of claim 9 wherein said depositing includes forming said layers in a substantially evacuated environment.

14. A method of forming an image sensor array comprising:
    providing a substrate;
    depositing a plurality of amorphous silicon layers under continuous vacuum conditions to form a wide area photo diode structure;

forming a continuous transparent layer atop said wide area photo diode structure;

patterning said continuous transparent layer using photolithographic techniques, thereby providing openings;

etching through said amorphous silicon layers to form gaps aligned with said openings while retaining portions of the amorphous silicon layers, thereby establishing an array of isolated pixels of photo diodes;

depositing insulating material having a high step coverage so as to at least substantially fill said gaps and cover said transparent layer having said openings; and selectively etching said insulating material from atop said transparent layer while preserving optical and electrical properties of said transparent layer for subsequent activations of said isolated pixels.

15. The method of claim 14 wherein said selective etching includes planarizing said insulating material.

16. The method of claim 14 wherein said depositing of said amorphous silicon layers includes forming a PIN photosensitive area.

17. The method of claim 14 wherein said patterning said continuous transparent layer includes using photolithographic techniques and a photomask layer that is removed prior to said step of depositing insulating material, said photomask layer being removed by one of dry etching, wet stripping or in-situ techniques.

* * * * *